United States Patent Office 3,068,557

Patented Dec. 18, 1962

3,068,557

SEMICONDUCTOR DIODE BASE

John C. Kosco and Alfred J. Schutz, St. Marys, Pa., assignors to Stackpole Carbon Company, St. Marys, Pa., a corporation of Pennsylvania No Drawing. Filed Sept. 1, 1961, Ser. No. 135,461
11 Claims. (Cl. 29—182.2)

Diodes are made from a semiconductor, such as silicon or germanium, in the form of wafers. These wafers are very thin and fragile, and to give them adequate support as well as to prevent thermal fracture in use the practice has been to join such wafers to one face of a rigid base material the other face of which is joined to a heat sink, commonly copper. Such bases should ideally have a thermal coefficient of expansion near that of the semiconductor, they must withstand thermal stresses created at the junctions between the base and the semiconductor wafer and between the base and the heat sink, and they should have good heat conductivity so as to keep the semiconductor cool.

Molybdenum and tungsten and a silver-tungsten material have been used as diode bases. Although they permit satisfactory joining to the semiconductor wafer and to copper, they are not wholly satisfactory for this purpose because their thermal coefficient of expansion are substantially higher than is desired with silicon wafers, for which the diode base should have a coefficient of about $2\times10^{-6}/°$ C., which is substantially lower than the coefficients of the aforementioned base materials. Also, it would be desirable for diode base materials to have better heat conductivity than is supplied to the molybdenum and tungsten bases.

It is among the objects of the invention to provide diode bases which are readily made by conventional procedures from commonly available materials, which are adapted to be joined by conventional practices to diode wafers and to conventional heat sinks, which have coefficients of expansion desirably close to that of the semiconductor, and which possess better heat conductivity than molybdenum or tungsten.

A further object is to provide a method of making such diode bases that is simple and readily practiced.

Other objects will appear from the following specification.

We have discovered that the thermal coefficient of expansion of appropriately consolidate compositions of silver and graphite in proper proportions is such as to adapt them to use as diode bases. However, such compositions are not readily joined, as by brazing, to the semiconductor and to a copper heat sink. We have found, however, that in accordance with the present invention the desirable properties of silver-graphite compositions are maintained while brazability is achieved by disposing the silver-graphite composition between layers of silver. In accordance with the invention, therefore, there are provided diode bases consisting essentially of a sandwich of a sintered silver-graphite composition between thin layers of silver.

A composition of equal parts by weight of silver and graphite possesses a thermal coefficient of expansion of about $3.6\times10^{-6}/°$ C., which satisfactorily suffices for the mounting of silicon wafers. If desired, still lower coefficients may be obtained by using lesser amounts of silver relative to graphite. Higher coefficients such as right be desired for other semiconductors are to be had with compositions containing larger proportions of silver; for instance a composition of, by weight, 60 parts of silver with 40 parts of graphite has a coefficient of about $6.7\times10^{-6}/°$ C. For the purposes of this invention we find that these compositions may range from, by weight, 40 parts of silver with 60 parts of graphite to 70 parts of silver with 30 parts of graphite. In this way the expansion coefficient can be adjusted to particular semiconductors.

In the preferred practice of the invention these new bases are made by well known powder metallugry methods. Thus, a layer of powdered silver is disposed in a mold and there is placed in contact with that layer a layer of an intimate mixture of powdered silver and powdered graphite upon which there is then placed a layer of powdered silver. This assembly of layers is then subjected to high pressure followed by heating to a sintering temperature in a neutral atmosphere, and the thus sintered assembly is then coined at high pressure to form an integrated composite of the three layers. Alternatively, the assembly may be hot pressed in accordance with knowledge in the powder metalurgy art, in which case sintering is effected during the hot pressing.

The details of such procedures are well known to those skilled in the art, and they are not critical. As an example, however, a layer approximately 0.005 to 0.01" thick of silver of about 325 mesh (Tyler) particle size is placed in a mold, the bottom punch is dropped and there is added a layer of an intimate mixture of silver and graphite, both of about 325 mesh (Tyler) particle size and composed of about equal parts by weight of the two, the punch is dropped again and a layer of silver powder similar to that first placed in the mold is then deposited on the silver-graphite layer. The composite thus assembled is then pilled at, suitably, 10 to 40 tons per square inch. The pills are sintered at about 1500° F. in a neutral atmosphere, or in vacuum, following which the sintered bases are coined at 20 to 40 tons per square inch. Such factors as particle size, pilling and coining pressures and sintering temperature are well within the knowledge and skill of those familiar with powder metallurgy practices.

The thicknesses of the various layers of these bases will be dictated by the requirements of the base and assembly. Commonly for a diode base varying from ⅜" to ¾" diameter the thickness is about 0.150". For such a base the silver layers may be from about 0.005 to 0.01" thick so that the intermediate silver-graphite layer in such a case would vary from about 0.140 to 0.130" thickness. However, we have produced bases with silver thicknesses varying from 0.002 to 0.020" thick. In some cases it may be desirable that the silver layer to be attached to a heat sink be of greater thickness than that joined to the wafer, to relieve thermal stresses between the silver layer and the heat sink.

Bases produced in accordance with this invention thus meet the requirement for a thermal coefficient of expansion near that of the semiconductor. Additionally, they are readily brazed, as by hard or soft solders, to the semiconductor wafer and to the heat sink, such as copper, and they adequately withstand thermal stresses that may be set up at the two brazed junctions. Additionally, they have the advantage in comparison with molybdenum and tungsten bases that their thermal conductivity is higher, which is desirable.

Brazing of the base to the diode wafer and the heat sink is accomplished readily using hard or soft solders and firing in a neutral atmosphere or under vacuum in accordance with techniques well known to those familiar with the art.

Although the invention has been described with reference to production of these bases by purely powder metallurgy methods, it will be understood that the silver layers may be produced by flame spraying silver on the faces of the pre-sintered silver-graphite mixture.

Although the invention has been described with particular reference to silver-graphite compositions it contemplates likewise base compositions of copper and graphite which may be made and faced with silver in the manners described above. The amount of copper used in this embodiment is to be such that the volume of the base will be comparable to that of a silver-graphite base within the composition range stated above; this is readily determinable from the relative specific gravities of silver and copper. Thus in the case of copper the bases may range from about, by weight, 38 percent of copper with 62 percent of graphite to 69 percent of copper with 31 percent of graphite.

Furthermore, although the invention has been described in detail with respect to its preferred embodiment in which the diode is faced on both sides with silver, it is to be understood that the invention contemplates also embodiments in which one surface of the diode is faced with silver and the other faced with copper, and in which both surfaces are faced with copper. This can be done in the manner and with the advantages described above for the case of facing both surfaces with silver.

According to the provisions of the patent statutes, we have explained the principle of our invention and have described what we now consider to represent its best embodiment. However, we desire to have it understood that, within the scope of the appended claims, the invention may be practiced otherwise than as specifically described.

We claim:

1. A semiconductor diode base consisting essentially of a layer of a metal of the group consisting of silver and copper, an intermediate sintered layer of a composition selected from the group consisting of, by weight, (*a*) from 40 to 70 parts of silver powder with 60 to 30 parts of graphite powder, and (*b*) from 38 to 69 parts of copper powder with 62 to 31 parts of graphite powder, and an overlying layer of a metal of the group consisting of silver and copper.

2. A semiconductor diode base consisting essentially of a layer of silver, an intermediate sintered layer of a composition selected from the group consisting of, by weight, (*a*) from 40 to 70 parts of silver powder with 60 to 30 parts of graphite powder, and (*b*) from 38 to 69 parts of copper powder with 62 to 31 parts of graphite powder, and an overlying layer of silver.

3. A semiconductor diode base consisting essentially of an integrated composite of a layer of sintered silver powder, an intermediate sintered layer consisting essentially of, by weight, from 40 to 70 parts of silver powder with 60 to 30 parts of graphite powder, and an overlying layer of sintered silver powder.

4. A silicon diode base consisting essentially of an integrated composite of a layer of sintered silver powder, an intermediate sintered layer consisting essentially of, by weight, about equal parts of silver and graphite, and an overlying layer of sintered silver powder.

5. That method of making a base for a semiconductor diode comprising providing a layer of a metal of the group consisting of silver and copper, applying thereto a layer of an intimate mixture of a composition selected from the group consisting of, by weight, (*a*) 40 to 70 parts of silver powder and 60 to 30 parts of graphite powder, and (*b*) from 38 to 69 parts of copper powder with 62 to 31 parts of graphite powder, applying to the silver-graphite layer a layer of a metal of the group consisting of silver and copper, compacting the assembly thus produced under high pressure, and compacting and heating the composite.

6. That method of making a base for a semiconductor diode comprising providing a layer of silver, applying thereto a layer of an intimate mixture of a composition selected from the group consisting of, by weight, (*a*) 40 to 70 parts of silver powder and 60 to 30 parts of graphite powder, and (*b*) from 38 to 69 parts of copper powder with 62 to 31 parts of graphite powder, applying to the silver-graphite layer a layer of silver, compacting the assembly thus produced under high pressure, and compacting and heating the composite.

7. That method of making a base for a semiconductor diode comprising providing a layer of silver, applying thereto a layer of an intimate mixture consisting essentially of, by weight, 40 to 70 parts of silver powder and 60 to 30 parts of graphite powder, applying to the silver-graphite layer a layer of silver, and compacting the assembly thus produced under high pressure while heating it.

8. That method of making a base for a semiconductor diode comprising providing in a mold a layer of a metal of the group consisting of silver powder and copper powder, applying thereto a layer of an intimate mixture consisting essentially of, by weight, 40 to 70 parts of silver powder and 60 to 30 parts of graphite powder, applying to the silver-graphite layer a layer of a metal of the group consisting of silver powder and copper powder, compacting the assembly thus produced under high pressure, and heating the compacted composite at a sintering temperature.

9. A method according to claim 8 in which the sintered compact is coined under high pressure.

10. That method of making a base for a semiconductor diode comprising providing in a mold a layer of silver powder, applying thereto a layer of an intimate mixture of a composition selected from the group consisting of, by weight, (*a*) 40 to 70 parts of silver powder and 60 to 30 parts of graphite powder, and (*b*) 38 to 69 parts of copper powder with 62 to 31 parts of graphite powder, applying to the silver-graphite layer a layer of silver powder, compacting the assembly thus produced under high pressure, and thereafter heating the compacted composite at a sintering temperature.

11. A method according to claim 10 in which the sintered compact is coined under high pressure.

No references cited.